United States Patent [19]

Schleicher et al.

[11] Patent Number: 5,346,862
[45] Date of Patent: Sep. 13, 1994

[54] METHOD FOR THE ELECTRICAL INSULATION OF A CIRCUIT FUNCTION ELEMENT ON A SEMICONDUCTOR COMPONENT

[75] Inventors: Lothar Schleicher, Munich; Hans-Peter Zwicknagl, Stuttgart; Elke Schoening, Munich, all of Fed. Rep. of Germany

[73] Assignee: Siemens Aktiengellschaft, Munich, Fed. Rep. of Germany

[21] Appl. No.: 55,351

[22] Filed: May 3, 1993

[30] Foreign Application Priority Data

Jun. 22, 1992 [DE] Fed. Rep. of Germany ....... 4220315

[51] Int. Cl.$^5$ ........................................... H01L 21/465
[52] U.S. Cl. .................................. 437/228; 437/231; 437/948; 156/646; 156/649; 156/659.1
[58] Field of Search ............... 437/228, 229, 231, 948, 437/225; 148/106; 156/644, 646, 659.1, 649

[56] References Cited

U.S. PATENT DOCUMENTS

| | | | |
|---|---|---|---|
| 4,447,290 | 5/1984 | Matthews | 437/228 |
| 4,676,868 | 6/1987 | Riley et al. | 156/643 |
| 4,839,311 | 6/1989 | Riley et al. | 437/228 |
| 4,939,105 | 7/1990 | Langley | 437/228 |

FOREIGN PATENT DOCUMENTS 0188897 7/1986 European Pat. Off. .

OTHER PUBLICATIONS

IEEE 1991 Bipolar Circuits and Technology Meeting Minneapolis, Minn.
Journal of Crystal Growth 107 (1991) pp. 883–892.
Electronics Letters vol. 25, No. 2 (1989) pp. 127–128.

*Primary Examiner*—Olik Chaudhuri
*Assistant Examiner*—H. Jey Tsai
*Attorney, Agent, or Firm*—Hill, Steadman & Simpson

[57] ABSTRACT

Method for the electrical insulation of a function element on a semiconductor component, wherein the function element is etched into a mesa (9) using a mask (8). A dielectric (10) is then applied surface-wide at least up to the height of the mesa (9). The more deeply disposed portions of this dielectric layer are covered with photoresist (11), and the photoresist (11) is caused to flow by tempering and, thus, is caused to level the surface. Finally, the photoresist (11) and the dielectric (10) are re-etched with the same etching rate until the mesa is uncovered.

12 Claims, 2 Drawing Sheets

METHOD FOR THE ELECTRICAL INSULATION OF A CIRCUIT FUNCTION ELEMENT ON A SEMICONDUCTOR COMPONENT

BACKGROUND OF THE INVENTION

The present invention is directed to a method for the electrical insulation of a function element, particularly a transistor, on a semiconductor component on which further function elements are integrated.

Hetero-components on semiconductor material partly contain highly conductive semiconductor layers that cover the entire semiconductor wafer in a thickness of 1 through 2.5 μm; individual function elements of such a component must therefore be electrically insulated from the remaining parts of the component. Various methods have been previously disclosed for forming this insulation.

Insulation regions can be produced in the semiconductor material by deep insulation implantation, for example with B++ given acceleration voltages in the MV range, or with H+, O+. Disadvantages of these methods are that they are fundamentally not employable for highly doped layers, so that a combination of this implantation with re-etching of the semiconductor material is required. Moreover, the implantation requires complex equipment that is not easily available. Extremely narrow function elements etched as mesas cannot be insulated with this method because of the lateral scatter of the implantation. When the width of the mesa falls below twice the depth of the mesa, the upper parts of the mesa are electrically insulated from the lower parts thereof, i.e., are cut off by the implantation. A boron implantation is temperature-stable up to only approximately 450° C.

Electrically separating every individual function element on the semiconductor component from the others by separate etching of a mesa, as disclosed, for example, in the publication by S. J. Prasad et al., "An Implant-Free AlGaAs/GaAs HBT IC Technology Incorporating 1.4 THz Schottky Diodes" in IEEE 1991 Bipolar Circuits and Technology Meeting Jul. 3, Minneapolis, Minn., has the disadvantage that problems derive in the phototechnique employed and in the coverage of the steps with metallizations. A further possibility of insulation is established by etching insulating trenches that are subsequently filled with a dielectric (similar to the oxide insulation processes of bipolar silicon technology). For example, such a method is disclosed in the publication by G. Packeiser, H. Tews, P. Zwicknagl, "High Frequency AlGaAs/GaAs Hetero-Junction Bipolar Transistors: The Role of MOVPE", Journal of Crystal Growth 107, 883–892 (1991).

Another method involves etching mesas and subsequently filling of the regions situated between these mesas with polyimide. The employment of polyimide as a planarizing material is disclosed, for example, in L. G. Shantharama, H. Schumacher, J. R. Hayes, Z. Bhat, R. Esagui, M. Koza, "Fully Self-Aligned Microwave InP/GaInAs Single Heterojunction Bipolar Transistors", Electronic Letters 25, 127 through 128 (1989). Some of the disadvantages of using polyimide are surface roughness, premature aging due to high absorption of moisture, shrinkage and limited temperature stability of the polyimide.

A method for planarizing the surface of a semiconductor component with a dielectric is disclosed, for example, by EP 0 416 165 A1.

SUMMARY OF THE INVENTION

It is an object of the present invention to specify a method for the electrical insulation of a function element on a semiconductor component that supplies a planar surface of the component and does not have the above-described disadvantages.

The object of the invention is inventively achieved with a method for the electrical insulation of a function element on a semiconductor component wherein the function element is etched to form a mesa in a first step. In a second step, a dielectric is applied completely covering the mesa, surface-wide, at least up to the height of the mesa. In a third step, a photoresist having high flowability, given temperature treatment, is applied onto the portions of the dielectric present at the side of the mesa, being applied upon employment of a mask. In a fourth step, the surface of the dielectric is planarized with the flowing photoresist in a fourth step by tempering. In a fifth step, the photoresist and the dielectric are re-etched with the same etching rate until the mesa is uncovered.

This method can be advantageously employed for the manufacture of a transistor. The dielectric can be $Si_3N_4$, SiON or $SiO_2$. The fifth step of the method can employ dry etching.

DETAILED DESCRIPTION OF THE PREFERRED EMBODIMENT

Figure 1:
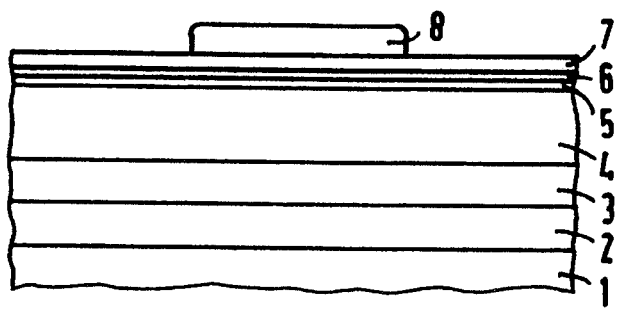
FIG. 1 is a sectional view of a processed component of the present invention.
Figure 2:
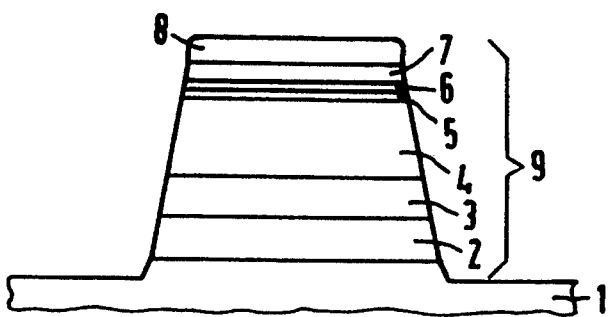
FIG. 2 is a sectional view of a further processed component of FIG. 1.

In the manufacturing method of the invention, the function element is etched as a mesa and is planarized with dielectric for electrical insulation. The function element contains at least one highly doped semiconductor layer produced by implantation or epitaxy. For illustration, a layer sequence applied on a substrate 1 is shown as an example in the figures. This, for example, can be the layer sequence for a transistor. As shown in FIG. 1, a buffer layer 2, a sub-collector layer 3, a collector layer 4, a base layer 5, an emitter layer 6, and a cover layer 7 are applied on top of one another on the substrate in this example. Instead of being employed for a transistor, of course, the method of the invention can be fundamentally employed for any arbitrary function element. A mask 8 that covers the region of the function element is applied on the uppermost layer (the cover layer 7 in FIG. 1) in the region of the function element to be insulated. For example, this mask is structured with a phototechnique. The electrically conductive semiconductor layers of the function element are etched off to the side of this mask 8. The mesa 9 illustrated in FIG. 2 is thus produced. In this example, the etching ensues down into the substrate 1, so that all semiconductor layers to the side of the mask 8 are etched off. In a transistor, this mesa 9 has a height of approximately 2 through 3 μm.

Figure 3:
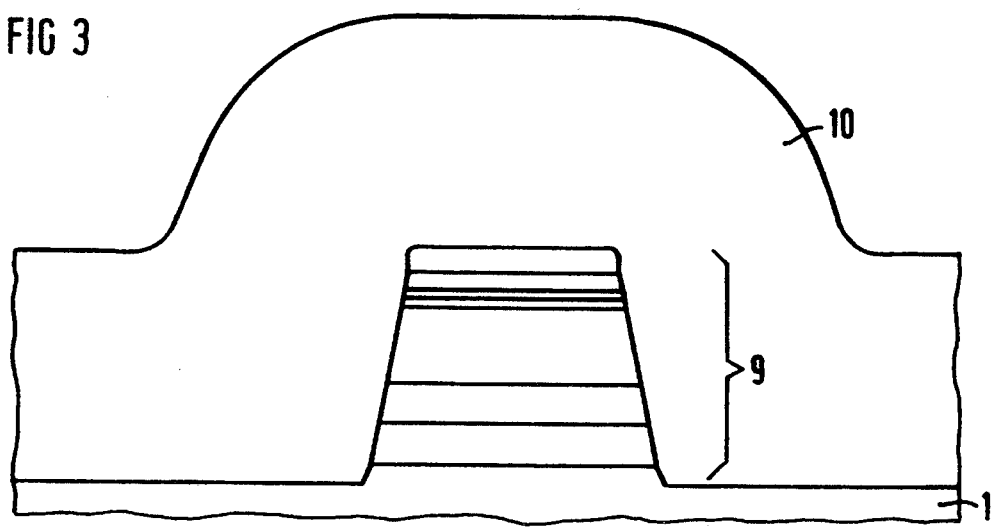
FIG. 3 is a sectional view of a further processed component of FIG. 2.

The structure shown in FIG. 2 is subsequently covered surface-wide with a dielectric 10, as shown in FIG. 3. The dielectric 10 is thereby applied at least up to the height of the mesa 9, so that the dielectric 10 to the side of the mesa 9 comprises at least the same height as the mesa 9 and also completely covers the mesa 9. This dielectric is selected such that no current channels form at the boundary layer to the semiconductor material and no off-state currents and pn-junctions are increased in the semiconductor material at the edge of the layers. The dielectric 10, moreover, is temperature-stable up to temperatures above 500° C.

Figure 4:
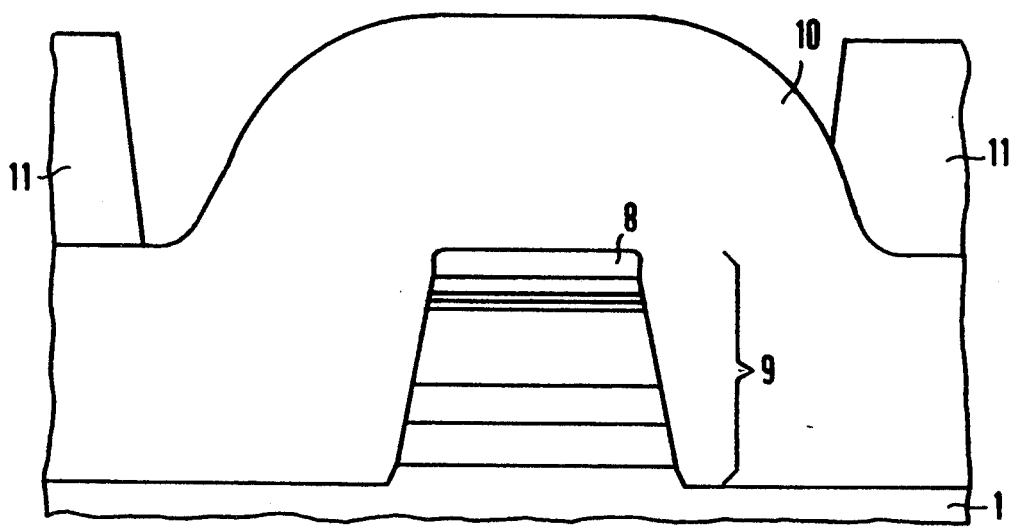
FIG. 4 is a sectional view of a further processed component of FIG. 3.

Subsequently, as illustrated in FIG. 4, the more deeply disposed regions of the dielectric 10, i.e., those parts of the dielectric 10 situated to the sides of the mesa 9, are covered using a phototechnique with a photoresist 11 having high flowability given temperature treatment. For example, Microposit 111 S, Shipley Europe Limited, thereby comes into consideration as photoresist. This photoresist is applied in a thickness approximately corresponding to the height of the mesa 9. It is thereby assured that the dielectric 10 can be planarized with this photoresist 11.

Figure 5:
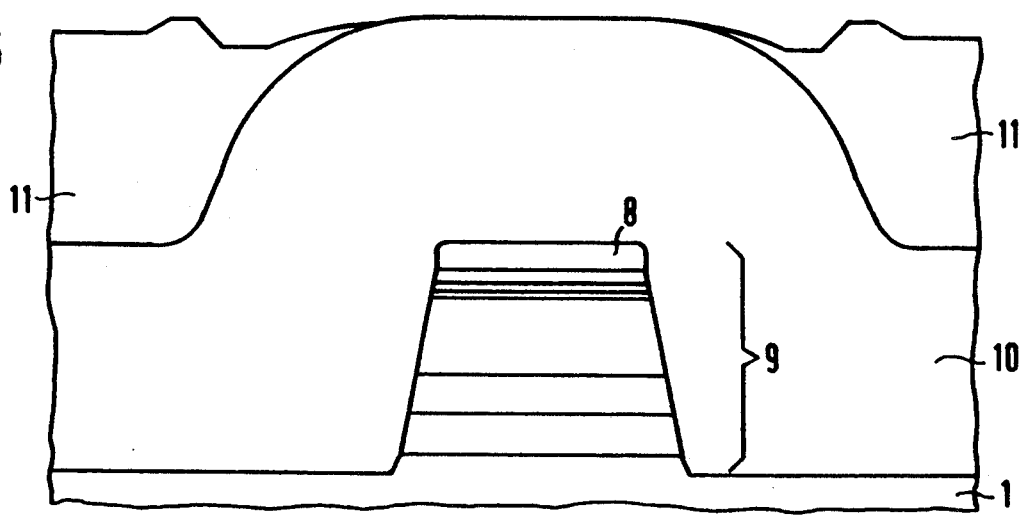
FIG. 5 is a sectional view of a further processed component of FIG. 4.

The method step wherein this photoresist 11 is applied with a phototechnique is relatively uncritical in alignment because of the self-aligning effect that occurs upon flowing of the photoresist. When the photoresist is exposed to a temperature treatment, this photoresist flows onto the side walls of the dielectric 10 situated above the mesa 9, as shown in FIG. 5. The dielectric 10 is planarized by the photoresist in this way. The structure following this method step is shown in FIG. 5.

The photoresist 11 and the dielectric 10 are then etched back with approximately the same etching rate until the mesa 9 is uncovered. Given the typical dimension for the height of the mesa 9 recited in FIG. 2, a tolerance in the thickness of the re-etched dielectric layer of approximately 0.1 μm suffices for this etching step. Dry etching (RIE or CAIBE) is preferably employed for etching. The mask 8 and residues of the leveling photoresist layer that may still be potentially present can also be subsequently removed as warranted.

Figure 6:
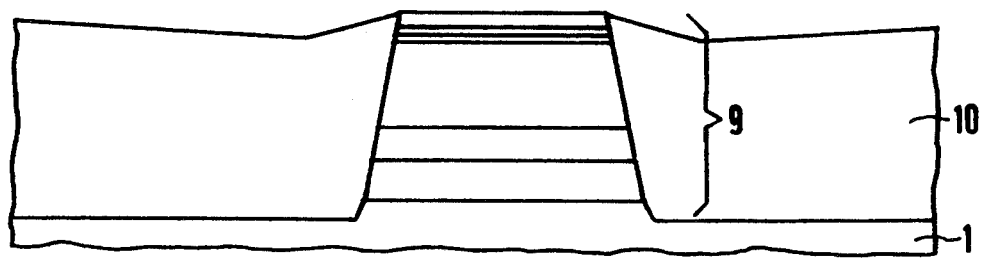
FIG. 6 is a sectional view of a further processed component of FIG. 5.

Metal (for example, titanium, tantalum) or a dielectric (for example, $Si_3N_4$, $SiO_2$) come into consideration as material for the mask 8. The etching of the mesa preferably ensues with dry etching (RIE or CAIBE). The dielectric 11, for example, is $Si_3N_4$, SiON or $SiO_2$. FIG. 6 shows the result of the method of the invention after the removal of the mask 8.

Although the present invention has been described with reference to a specific embodiment, those of skill in the art will recognize that changes may be made thereto without departing from the scope and spirit of the invention as set forth in the appended claims.

We claim as our invention:

1. A method for the electrical insulation of a circuit function element on a semiconductor component, comprising the steps of:
   etching the circuit function element to form a mesa;
   applying a dielectric that completely covers the mesa surface-wide at least up to a height of the mesa;
   employing a mask and applying photoresist having flowability with temperature treatment onto the portions of the dielectric present at the side of the mesa;
   planarizing the surface of the dielectric with the flowing photoresist by heating; and
   etching the photoresist and the dielectric with the same etching rate until the mesa is uncovered.

2. A method according to claim 1, wherein said function element is a transistor.

3. A method according to claim 2, wherein said step of etching the function element is further characterized by applying a mesa mask onto a top layer of the function element sized approximating the select top surface area of the mesa to be formed by the etching.

4. A method according to claim 3, comprising the further step of after the step of etching the photoresist, removing the mesa mask.

5. A method according to claim 2, wherein the dielectric is selected from the group consisting of $Si_3N_4$, SiON or $SiO_2$.

6. A method according to claim 2, wherein the step of etching the photoresist is a dry etching step.

7. A method according to claim 1, wherein the dielectric is selected from the group consisting of $Si_3N_4$, SiON or $SiO_2$.

8. A method according to claim 7, wherein the step of etching the photoresist is a dry etching step.

9. A method according to claim 1, wherein the step of etching the photoresist is a dry etching step.

10. A method according to claim 1, wherein said step of etching the function element is further characterized by applying a mesa mask onto a top layer of the function element said mesa mask sized approximating the select top surface area of the mesa to be formed by the etching.

11. A method according to claim 10, comprising the further step of after the step of etching the photoresist, removing the mesa mask.

12. A method according to claim 1, wherein said step of employing a mask is further characterized in that the photoresist is applied to a level approximately equal to the height of the dielectric above the mesa and not covering the dielectric above the mesa.

* * * * *